United States Patent [19]
Inoue

[11] Patent Number: 5,512,781
[45] Date of Patent: Apr. 30, 1996

[54] SEMICONDUCTOR PACKAGE DEVICE FOR SUPER HIGH-FREQUENCY BAND

[75] Inventor: Kazuhiko Inoue, Yokohama, Japan

[73] Assignee: Kabushiki Kaisha Toshiba, Kawasaki, Japan

[21] Appl. No.: 437,780

[22] Filed: May 9, 1995

Related U.S. Application Data

[63] Continuation of Ser. No. 159,308, Nov. 30, 1993, abandoned.

[30] Foreign Application Priority Data

Dec. 1, 1992 [JP] Japan ..................... 4-321853

[51] Int. Cl.⁶ .......................... H01L 23/13; H01L 23/48
[52] U.S. Cl. .................... 257/676; 257/696; 257/698; 257/728
[58] Field of Search ..................... 257/666, 676, 257/690, 728, 778, 787, 692, 693, 696, 698, 327, 213, 368

[56] References Cited

U.S. PATENT DOCUMENTS

| | | | |
|---|---|---|---|
| 5,134,448 | 7/1992 | Johnsen et al. | 257/369 |
| 5,157,480 | 10/1992 | McShane et al. | 257/787 |
| 5,285,352 | 2/1994 | Pastore et al. | 257/712 |

FOREIGN PATENT DOCUMENTS

| | | | |
|---|---|---|---|
| 0220346 | 9/1986 | Japan | 257/787 |
| 0134945 | 6/1987 | Japan | 257/787 |
| 0112345 | 7/1988 | Japan . | |
| 0258050 | 10/1988 | Japan | 257/787 |
| 0296252 | 12/1988 | Japan | 257/676 |
| 0022046 | 2/1989 | Japan . | |
| 0106449 | 4/1989 | Japan | 257/787 |
| 0255259 | 10/1989 | Japan | 257/787 |
| 0049460 | 2/1990 | Japan | 257/787 |
| 0079449 | 3/1990 | Japan . | |
| 0162751 | 6/1992 | Japan . | |

*Primary Examiner*—Peter Toby Brown
*Attorney, Agent, or Firm*—Oblon, Spivak, McClelland, Maier & Neustadt

[57] ABSTRACT

A semiconductor package device capable of reducing inductance as well as improving device mounting density by down-sizing a volume of the package device. The semiconductor package device includes: a lead having an inner lead connected to a ground portion where an end point of the lead coincides with a side face of a resin mold frame and there is provided a concave portion in the lead so that a ground-end lead is exposed; and the resin mold frame which encloses the semiconductor chip and the inner lead. Thereby, the lead is not extended externally of the mold frame, thus making the device further compact-sized. The concave shape is exposed so as to be smoothly and securely interconnected, through a contact window, to bump portions on a mounting substrate.

9 Claims, 5 Drawing Sheets

BUMP

BUMP

FIG.7

| TYPES | | NOISE FIGURE (dB) | ASSOCIATED GAIN (dB) |
|---|---|---|---|
| CONVENTIONAL CASE | CERAMIC PACKAGE | 0.7 | 10.5 |
| | MOLD PACKAGE | 1.0 | 8.0 |
| FIRST EMBODIMENT | | 0.6 | 12.0 |

SEMICONDUCTOR PACKAGE DEVICE FOR SUPER HIGH-FREQUENCY BAND

This application is a continuation of application Ser. No. 08/159,308, filed on Nov. 30, 1993, now abandoned.

BACKGROUND OF THE INVENTION

1. Technical Field

The present invention relates to a semiconductor device in which a semiconductor chip thereof is packaged with resin material, and it particularly relates to the semiconductor device which is utilized in a super high-frequency band.

2. Background Art

In a semiconductor device used under a super high frequency of more than 12 GHz, a characteristic of the device is affected by inductance (L) and capacitance (C) of current lines. The current lines include a bonding wire, inner lead and outer lead which serve to connect a semiconductor chip to outer portions. In particular, a parasitic source inductance of a source of the semiconductor chip greatly affects characteristics such as noise figure (NF) and associated gain (Ga). As a result thereof, in a package of the semiconductor chip used under the high frequency, there is employed a structure in view of the above-mentioned points.

FIG. 1A and FIG. 1B show a conventional example of the package in which the semiconductor chip is shielded with ceramic. FIG. 1A is a top view thereof and FIG. 1B is a cross sectional view substantially taken along line IB—IB shown in FIG. 1A.

Referring to FIG. 1B, a single unit of field effect transistor (FET), serving as semiconductor chip 50, is mounted and sealed on a thin metal layer 51 formed, at thickness of approximately 2–3 μm, on the ceramic serving as packaging material. In semiconductor chip 50 thus packaged, source, drain and gate terminals of the device 50 are respectively pulled out by metal layer 51 and connected to outer leads 52, 53, 54 of source, drain and gate, respectively.

In such a conventional structure shown in FIG. 1A, and FIG. 1B, the thickness of metal layer 51 is thinner by some μm's compared to that of outer leads 52, 53, 54. As a result thereof, signal transmission loss is caused in substrate material of metal layer 51, due to a dielectric loss of ceramic such as alumina. Thereby, the noise figure (NF) and associated gain (Ga) therefor deteriorate.

Moreover, a production process in the package of the ceramic is complicated and costly, so that it is not suitable for mass production scheme.

FIG. 2A and FIG. 2B show a conventional example of the package in which the semiconductor chip used under the high-frequency band is shielded with resin. FIG. 2A is a top view thereof and FIG. 2B is a cross sectional view substantially taken along line IIB—IIB shown in FIG. 2A.

Referring to FIG. 2A and FIG. 2B, inner lead 57 on which semiconductor chip 56 shielded with resin package material 55 is mounted, requires that thickness of resin located under inner lead 57 be more than a predetermined value such as greater than 0.33 mm. Thereby, a vertical distance is undesirably great between a surface of inner lead 57 (that is, for example, a source terminal surface connected to a ground potential) and ground potential surface 59 to which outer lead 58 and the ground potential are connected. Such a vertical distance is illustrated as VERTICAL DISTANCE in FIG. 2B. As a result, an inductance for inner lead 57 becomes undesirably great-valued.

Moreover, the distance between a connecting portion of outer lead 58 and the ground potential, and the source terminal of semiconductor chip 56 is rather long and is not sufficiently close enough. Circumference of inner lead 57 is enclosed by resin having greater dielectric loss than that of alumina. As a result thereof, inductance therefor is significantly larger than that for ceramic package. Therefore, the noise figure as well as associated gain therefor is greatly deteriorated. When δ represents dielectric loss angle, tan δ=0 for air, whereas tan δ=0.016 for resin.

On the other hand, in order that the thickness of the resin disposed below inner lead 57 is made thin and the inductance therefor is reduced, the resin thickness needs to be set at 0.1 mm or lower. Then, it is very difficult for the structure shown in FIG. 2A and FIG. 2B inner lead 57 to keep its configuration as such. The manufacture therefor is also difficult to achieve.

Furthermore, referring to FIG. 1B, in the conventional scheme, there are caused problems where a cap need be bonded so as to cause complication in processing thereof and to cause to necessitate an inspection process such as a shielding test.

Accordingly, the inductance for the inner leads connecting the chip and the outer portions becomes undesirably large in the conventional package made of ceramic or resin that stores the semiconductor chip under use of the high frequency band. As a result, there is caused a problem where the high-frequency characteristic in the noise figure and associated gain is deteriorated.

SUMMARY OF THE INVENTION

In view of the foregoing drawbacks, it is therefore an object of the present invention to provide a semiconductor device that improves high-frequency characteristic and cost performance.

To achieve the object, there is provided a semiconductor package device having a semiconductor chip therein, comprising: a lead including an inner lead connected to a ground portion where an end point of the lead coincides with a side face of a resin mold frame and there is provided a concave portion in the lead so that a ground-end lead is exposed; and the resin mold frame which encloses the semiconductor chip and the plural inner leads.

The concave portion is smoothly coupled to a bump portion projected from an external plate, a transmission loss for the device is minimized and thickness of the mold frame at bottom thereof is comparatively very thin.

Other features and advantages of the present invention will become apparent from the following description taken in conjunction with the accompanying drawings.

BRIEF DESCRIPTION OF THE DRAWINGS

FIG. 2A is a cross sectional view taken along line IIB—IIB shown in FIG. 2A.

FIG. 3A is a top view; FIG. 3B is a bottom view; FIG. 3C is a cross sectional view taken along line IIIC—IIIC shown in FIG. 3A; and FIG. 3D is a cross sectional view taken along line IIID—IIID shown in FIG. 3A and FIG. 3B.

FIG. 6A is a top view; FIG. 6B is a bottom view; FIG. 6C is a cross sectional view taken along line VIC—VIC shown in FIG. 6A; and FIG. 6D is a cross sectional view taken along line VID—VID shown in FIG. 6A and FIG. 6B.

FIG. 7 is a table showing results measured concerning the high-frequency characteristics.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Figure 3A:
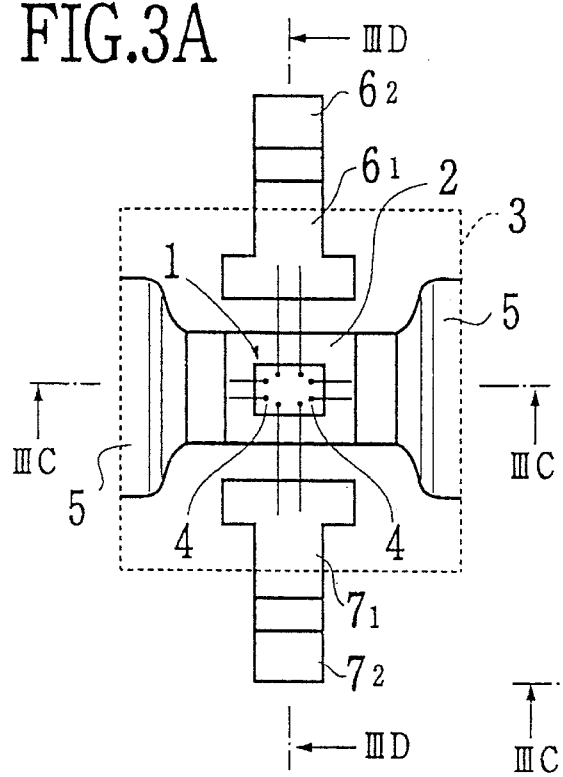
FIGS. 3A, 3B, 3C and 3D show a semiconductor device according to the first embodiment of the present invention.
Figure 3B:
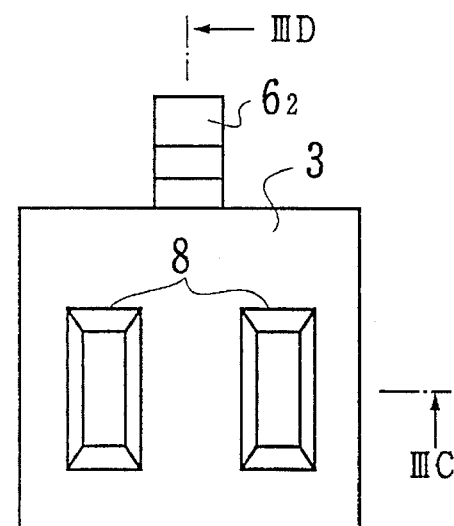
Figure 3C:
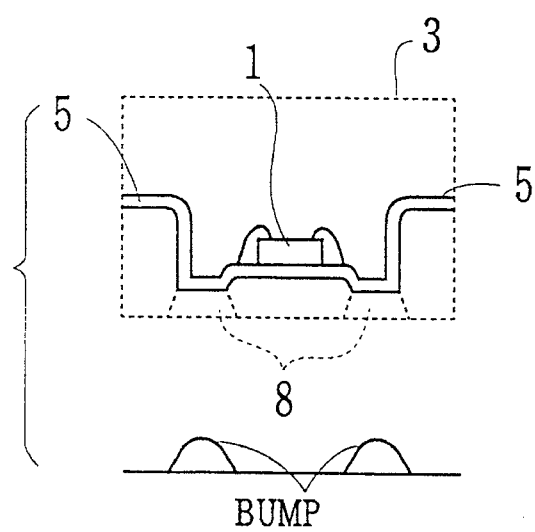
Figure 3D:
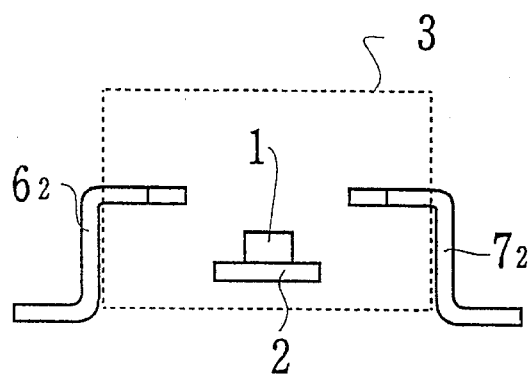
Figure 4:
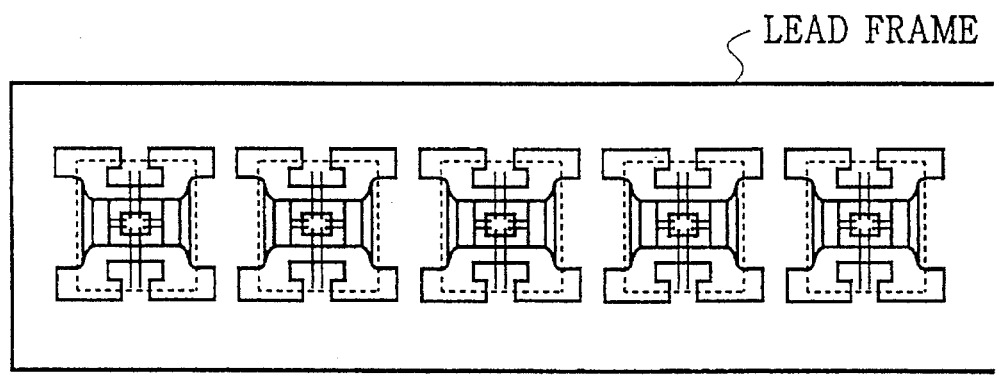
FIG. 4 shows a lead frame, on a bed portion of which the semiconductor chip 1 is mounted.

FIGS. 3A, 3B, 3C and 3D show a semiconductor device according to the first embodiment of the present invention. FIG. 3A is a top view; FIG. 3B is a bottom view; FIG. 3C is a cross sectional view taken along line IIIC—IIIC shown in FIG. 3A; and FIG. 3D is a cross sectional view taken along line IIID—IIID shown in FIG. 3A and FIG. 3B.

In the same figures, semiconductor chip 1 of, for example, field effect transistor used for high frequency is mounted on bed portion 2 of lead frame or lead (shown in FIG. 3D) and is molded by resin packaging body 3. Source terminal 4 of semiconductor chip 1 is connected to inner lead 5 for use with the source. In a similar manner, a drain terminal and a gate terminal are connected to inner lead $6_1$ for use with the drain and inner lead $7_1$ for use with the gate, respectively. Inner leads $6_1$, $7_1$ are connected to external portions thereof via outer lead $6_2$, $7_2$, respectively.

In this first embodiment, a feature of the present invention is applied to a source portion which greatly affects high-frequency characteristics.

Referring to FIGS. 3A through 3D, in inner lead 5, thickness of the resin located under bed portion 2 is formed at, for instance, approximately 0.05 mm which is desirably thin enough. Referring to FIG. 3C, in source terminal of semiconductor chip 1, a part of inner lead 5 in the vicinity of a portion connected to inner lead 5 is exposed through connection window 8. The thus exposed inner lead 5 is smoothly coupled to a soldering point of bump shape formed on a mounting substrate so as to be connected to a ground potential. The bump shape is projected from an external plate (the mounting substrate). Then, the exposed portion of inner lead 5 is disposed inside the circumference of resin packaging body 3, as shown in FIG. 3C. Therefore, a possible lateral flow of soldering material is reliably avoided.

Moreover, inner lead 5 is extended from the exposed portion to an end portion thereof within resin packaging body 3, and inner lead is terminated at a same side face of resin packaging body 3, as shown in FIG. 3C. By this structure and configuration as shown in FIG. 3C, since inner lead 5 is extended only inside resin packaging body so that inner lead 5 is firmly supported, the structure stands firmly enough even if the resin below bed portion 2 has a rather thin thickness.

By such a configuration achieved by the present invention, the thickness for the resin below bed portion 2 is thinner than a conventional case, and a ground potential surface to which the source terminal is connected serves as a base portion of resin packaging body 3. Thereby, the vertical distance between the source terminal face and the ground potential surface is significantly reduced over the conventional case. Similarly, since inner lead 5 is exposed from resin packaging body 3 before reaching an end point thereof, and is then connected to the ground potential, the distance between source terminal 4 and the ground potential is reduced.

According to the semiconductor structure employed by the present invention, the above embodiment is superior to the conventional one, concerning high-frequency characteristics. FIG. 7 is a table showing such measurement results concerning high-frequency characteristics in comparison to the conventional example. Referring to FIG. 7, according to the first embodiment, the inductance of the inner lead is reduced and a transmission line thereof is significantly shortened, so that transmission loss thereof is decreased. Thus, the noise figure and associated gain are improved in the high frequency band.

Figure 5A:
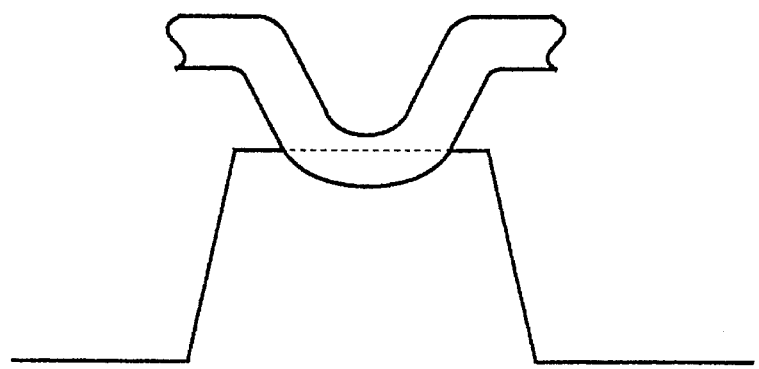
FIG. 5A is another scheme for a concave-shape portion and a connection window.
Figure 5B:
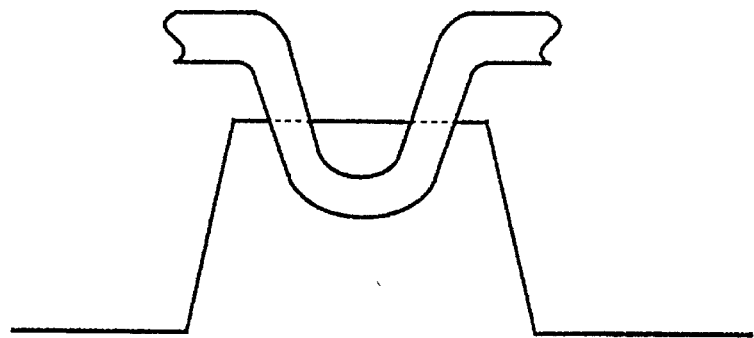
FIG. 5B is still another scheme for the concave-shape portion and the connection window.

It shall be appreciated that the shape and positional relationship of transmission line and connection window 8 may be as shown in FIG. 5A and FIG. 5B so as to give rise to similar advantageous effects as in FIG. 3C.

The novel inner lead 5 can be easily formed and manufactured by a press processing. Moreover, there is no need to use costly ceramic package, so that the device can be readily manufactured by utilizing the conventional assembly technique and apparatus, thus significantly reducing overall cost incurred in the production thereof.

Figure 6A:
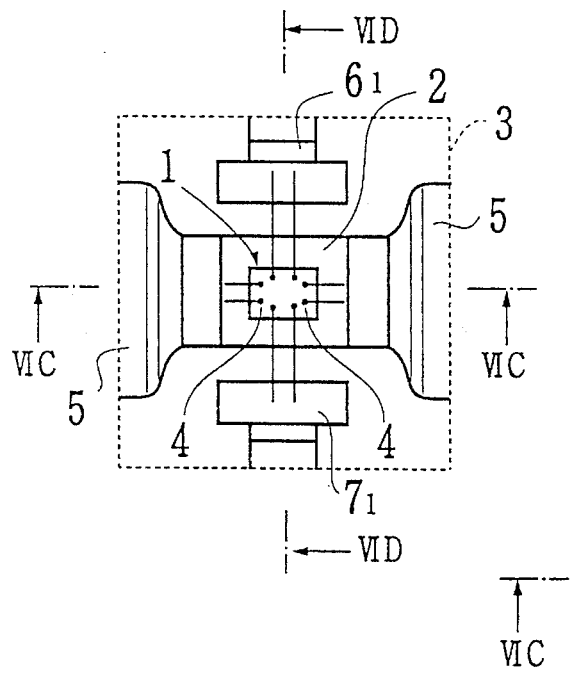
FIGS. 6A, 6B, 6C and 6D show a semiconductor device according to the second embodiment of the present invention.
Figure 6B:
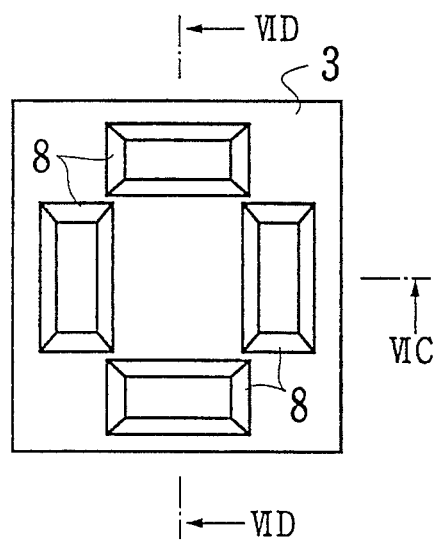
Figure 6C:
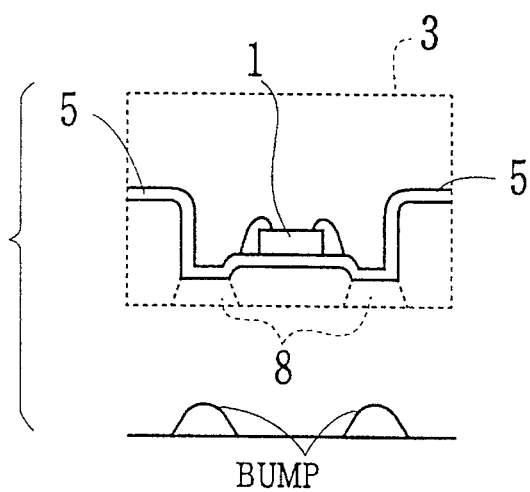
Figure 6D:
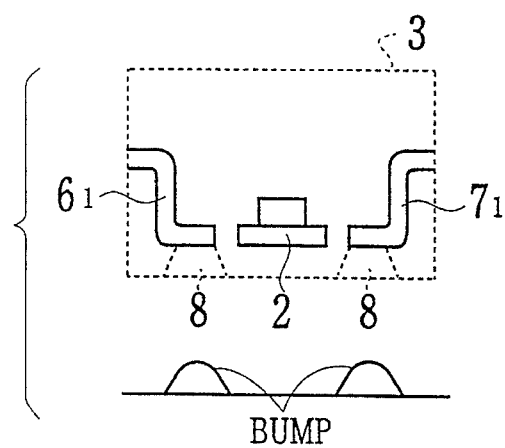

FIGS. 6A, 6B, 6C and 6D show a semiconductor device according to the second embodiment of the present invention. FIG. 6A is a top view; FIG. 6B is a bottom view; FIG. 6C is a cross sectional view taken along line VIC—VIC shown in FIG. 6A; and FIG. 6D is a cross sectional view taken along line VID—VID shown in FIG. 6A and FIG. 6B. In FIGS. 6A through 6D, the identical portions as in FIGS. 3A through 3D are given same reference numerals as in FIG. 3A through 3D.

The feature of the second embodiment lies in adopting an identical scheme employed in the source-use inner lead to inner leads $6_1$, $7_1$ for use with the drain and gate. In the second embodiment, the same advantageous effects can be achieved as in the first embodiment.

It shall be appreciated that the scheme may be applied to only one of inner leads $6_1$, $7_1$. Moreover, the first and second embodiment may be employed simultaneously. Now, the scheme mentioned here is typically that inner lead 5 connected to and extended from the chip 1 is exposed to have a concave shape portion and the rest of inner lead 5 is upwardly bent and then horizontally bent again until it reaches to the side face of resin packaging body 3.

Moreover, the scheme may be that the inner lead is exposed on or in the vicinity of the same circumference with that of resin packaging body 3, or the inner lead is exposed externally to the circumference of resin packaging body 3.

Moreover, the semiconductor chip and the inner lead may be connected by a wireless flip-chip bonding technique.

Moreover, the novel scheme of the present invention is not limited to FET but can be effectively applicable to any plastic package devices.

In summary, by employing the novel scheme according to the present invention, the source terminal surface is disposed in the close proximity of the ground potential surface, and the inner lead disposed near the portion to which the source terminal is connected is exposed from the resin packaging body so as to be connected to the ground potential. Thereby, the vertical distance between the source terminal surface and the ground potential surface is reduced, and the connecting distance between the source terminal and the ground potential is also reduced. Therefore, the parasitic inductance around the source terminal is desirably reduced, thus improving the high-frequency characteristics of the semiconductor device.

Moreover, the inner lead is extended from the exposed portion to within the resin packaging body. Thus, even in the event that the semiconductor chip is arranged and constructed in the vicinity of the circumferential surface of the resin packaging body, a holding power of the inner lead is sufficiently provided, so that necessary structural strength is safely maintained.

Figure 1A:
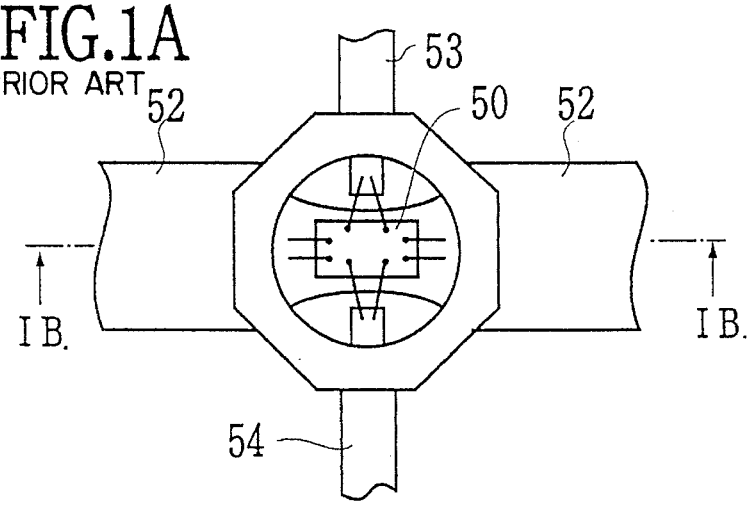
FIG. 1A is a top view of a conventional example of the package in which the semiconductor chip is shielded with ceramic.
Figure 1B:
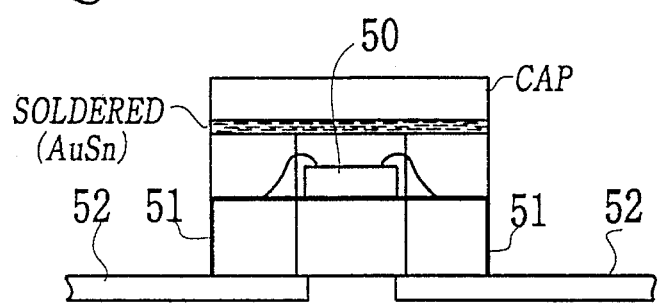
FIG. 1B is a cross sectional view substantially taken along line IB—IB shown In FIG. 1A.
Figure 2A:
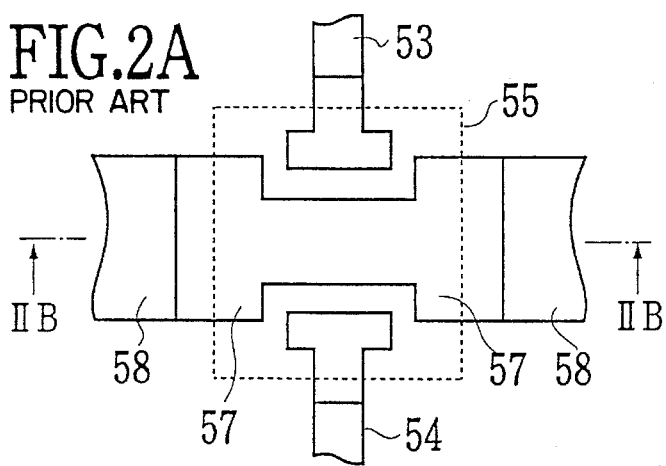
FIG. 2A is a top view of the package in which the semiconductor chip used under the high-frequency band is shielded with resin.
Figure 2B:
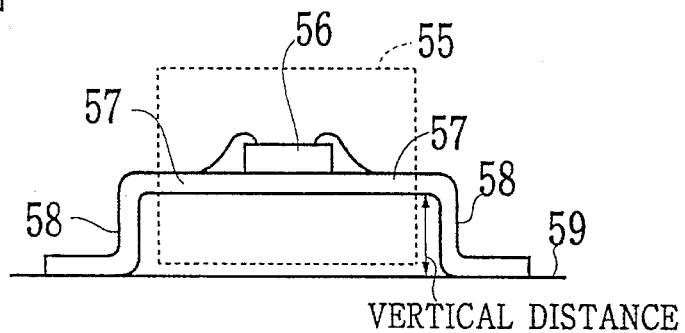

Moreover, by employing the novel scheme according to the present invention, the semiconductor chip is completely packaged with plastic, without presenting transmission line thereof being extended externally from the package. Thus, the leadframe therefor can be easily produced and relatively low-priced semiconductor device can be supplied. In other words, there is no more need to provide a costly ceramic-system frame and a package cap (see FIG. 1B). Thereby, an economically available package device can be produced having a good cost performance.

Overall, there is provided a concave portion or basin portion in resin mold frame, and the end point of the inner lead coincides with the side face of the mold frame. In other words, the lead is cut off along the side face of the mold frame so that the lead is not extended externally of the mold frame that is an outer circumference of the mold. In order for the package device to be connected to an external portion, part of lead is exposed by the novel concave configuration so that the part of thus exposed lead can be interconnected to the external mounting substrate having the bump portion or the like thereon. Accordingly, since the lead is not extended externally from the package device, an area and volume occupied thereby is reduced. As a result, a mounting density or packaging density is significantly improved.

By employing the feature of the present invention whereby the thickness of the resin mold frame is made thinner, the lead can be placed close to the source portion, so that the inductance therefor is reduced.

The concave portion according to the novel scheme of the present invention is smoothly coupled to the bump portion, so that there is secured a significantly improved coupling power and capability with the bump portion.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A transistor package for super high-frequency band having a semiconductor chip which has a source, a gate and a drain terminal, the package comprising:

a first inner lead having a bed portion mounting the semiconductor chip, the first inner lead serving as a base portion of the package;

a second inner lead and a third inner lead electrically disconnected from the first inner lead; and means for enclosing the first inner lead, the second inner lead and the third inner lead, the enclosing means including a connection window formed in the vicinity of the semiconductor chip, through which a portion of the first inner lead is exposed and electrically connected to an outer circuit, wherein the first inner lead is bent upward in the vicinity of a side face of the enclosing means and then bent again toward and substantially perpendicular to the side face of the enclosing means.

2. The device of claim 1, wherein:

the first inner lead is connected to the source terminal;

the second inner lead is connected to the drain terminal; and the third inner lead is connected to the gate terminal.

3. The device of claim 2, wherein an end point of the second inner lead coincides with a side face of the enclosing means and the connection window is realized by providing a concave portion in the first lead so that a ground-end lead is exposed through the connection window.

4. The device of claim 2, wherein an end point of the third inner lead coincides with a side face of the enclosing means and the connection window is realized by providing a concave portion in the first lead so that a ground-end lead is exposed through the connection window.

5. The device of claim 1, wherein an end point of the first inner lead coincides with a side face of the enclosing means, and further wherein plural connection windows are formed under concave portions of the first inner lead, and the first inner lead is connected to a ground potential of the outer circuit.

6. The device of claim 1, wherein the connection window is coupled to a soldering point of a bump portion of the outer circuit at a ground potential, so that the first inner lead is electrically connected to the ground potential, reducing a stray impedance associated with the first inner lead.

7. The device of claim 3, wherein a second connection window is formed under the second inner lead.

8. The device of claim 4, wherein a second connection window is formed under the third inner lead.

9. The device of claim 1, where plural connection windows are provided for said first, second and third inner leads.

* * * * *